United States Patent
Chen et al.

(10) Patent No.: US 7,260,444 B2
(45) Date of Patent: Aug. 21, 2007

(54) REAL-TIME MANAGEMENT SYSTEMS AND METHODS FOR MANUFACTURING MANAGEMENT AND YIELD RATE ANALYSIS INTEGRATION

(75) Inventors: Chien-Chung Chen, Hsinchu (TW); Sheng-Jen Wang, Hsinchu (TW); Yu-Wen Ho, Hsinchu (TW)

(73) Assignee: Powerchip Semiconductor Corp., Hsin-Chu (TW)

( * ) Notice: Subject to any disclaimer, the term of this patent is extended or adjusted under 35 U.S.C. 154(b) by 0 days.

(21) Appl. No.: 11/228,361

(22) Filed: Sep. 19, 2005

(65) Prior Publication Data
US 2006/0241802 A1 Oct. 26, 2006

(30) Foreign Application Priority Data
Apr. 26, 2005 (TW) .............................. 94113263 A

(51) Int. Cl.
*G06F 19/00* (2006.01)
(52) U.S. Cl. .................... 700/121; 700/99; 702/84; 257/E21.25
(58) Field of Classification Search .................. 700/99, 700/96, 121, 110, 117, 109; 702/84; 382/114, 382/149, 182, 1; 257/E21.252
See application file for complete search history.

(56) References Cited

U.S. PATENT DOCUMENTS

| | | | | |
|---|---|---|---|---|
| 5,971,586 A | * | 10/1999 | Mori | 700/108 |
| 2004/0228186 A1 | * | 11/2004 | Kadota | 365/202 |
| 2005/0149282 A1 | * | 7/2005 | Tseng et al. | 702/82 |
| 2005/0182596 A1 | * | 8/2005 | Chang | 702/182 |

FOREIGN PATENT DOCUMENTS

TW 574743 2/2004

* cited by examiner

*Primary Examiner*—Kidest Bahta
(74) *Attorney, Agent, or Firm*—Birch, Stewart, Kolasch & Birch, LLP

(57) ABSTRACT

A real-time management method for manufacturing management and yield rate analysis integration. A plurality of yield rates relating to wafer products are summed and averaged for a historical yield rate. Multiple representational inline QC parameters are selected. A statistical process is implemented and, if no extreme value and collinear parameter exists and if analysis results satisfy normal distribution, multiple optimum inline QC parameters are selected from the representational inline QC parameters. Weights of each optimum inline QC parameter are calculated. A predicted yield rate is calculated according to the historical yield rate, weights, and a plurality of measurement and target values relating to the wafer products.

10 Claims, 2 Drawing Sheets

REAL-TIME MANAGEMENT SYSTEMS AND METHODS FOR MANUFACTURING MANAGEMENT AND YIELD RATE ANALYSIS INTEGRATION

BACKGROUND

The invention relates to data management and analysis systems and methods, and more particularly, to real-time management systems and methods for manufacturing management and yield rate analysis integration.

Lot yield is important in semiconductor manufacturing, representing for not only manufacturing technology but also costs. Yield rate affects profits, such that increased yield poses a major concern in semiconductor manufacturing.

Complex industrial processes, such as those used in the manufacture of semiconductor integrated circuit devices, typically require tens to hundreds of tightly controlled individual steps and parameters to complete. Yield rate susceptibility is affected by electrical performance and performance of semiconductor equipment.

Defect testing checks and measures yield rate during the manufacturing process. Testing occurs after a product completes an individual step, with electrical testing measuring yield rate, after which the semiconductor product proceeds to the next step.

Inline defect testing scans for contamination or defects. Traditionally, defect testing analyzes yield rate from a single semiconductor tool or process, or like tools or processes, and cannot quickly identify problem sources in semiconductor equipment over multiple steps or unlike processes.

Additionally, defects in wafer products impact manufacturing cost and competition due to development of more accurately designed circuits relating to semiconductor manufacturing. Yield rate improvement and enhancement reduces manufacturing cost, and increases profit and industry competitiveness. Therefore, process control and engineer data analysis (EDA) technologies are implemented in the above purposes. With yield rate loss of wafer lots, detecting and improvement of possible causes if important, utilizing analysis of industrial data and determination based on experience and knowledge.

Generally, when analysis relating to yield rate loss of wafer lots is implemented, manufacturing data comprising process parameters, tool parameters, wafer defect data, wafer acceptance test (WAT) data, circuit probing (CP) data, and yield rate data is considered. Additionally, only one engineer is responsible to one type data that long time discussion between all engineers is required. Further, related manufacturing data from the beginning of a process to the final test affects to yield rates.

Current yield rate improvement methods attribute probable causes to yield rates according to one type of data, such as "Regression Tree Analysis (RTA)" disclosed in "Yield rate improvement using data mining system semiconductor manufacturing," IEEE International Symposium on. Conference Proceedings, 391–394 (1999) by Mieno et al. The RTA method is implemented in oxide process to prevent wafer yield rate loss, revealing variation parameters from a great number of process parameters to improve process drawbacks for yield rate promotion. With respect to defect analysis, Ken discloses signature of defect clustered concepts in "Using full wafer defect maps as process signatures to monitor and control yield rate," IEEE/SEMI Semiconductor Manufacturing Science Symposium, 129–135 (1991), using statistical process control (SPC) methods to detect clustered defects. Defects are not randomly distributed but clustered, whereby holography extraction can be utilized for determination, requiring extensive storage space.

As described, current yield rate loss analysis methods are performed on only one type data, although manufacturing data has relationships therebetween and yield rate loss issues can only be focused according thereto. Thus, an improved data analysis for yield rate improvement is desirable.

SUMMARY

Real-time management methods for manufacturing management and yield rate analysis integration are provided. In an embodiment of such a method, a plurality of yield rates and inline QC parameters relating to wafer products are collected in a predetermined period. The yield rates are summed and averaged for a historical yield rate. Multiple representational inline QC parameters are selected. A statistical process is implemented, comprising determination of whether at least one extreme value exists in the representational inline QC parameters, and if not, determination of whether at least one collinear parameter exists in the representational inline QC parameters, and, if not, determination of whether residual analyses relating to the statistical process satisfies normal distribution. If so, multiple optimum inline QC parameters are selected from the representational inline QC parameters. Weights of each optimum inline QC parameter are calculated. A predicted yield rate is calculated according to the historical yield rate, weights, and a plurality of measurement and target values relating to the wafer products.

Also disclosed are real-time management systems and methods for manufacturing management and yield rate analysis integration. An embodiment of such a system comprises a collection unit, a statistical unit, and a collection unit. The collection unit collects a plurality of yield rates and inline QC parameters relating to wafer products in a predetermined period. The statistical unit sums and averages the yield rates for a historical yield rate, selects multiple representational inline QC parameters, and implements a statistical process. The statistical process determines whether at least one extreme value exists in the representational inline QC parameters, if not, determines whether at least one collinear parameter exists in the representational inline QC parameters, and, if not, determines whether residual analyses relating to the statistical process satisfy normal distribution. If so, the statistical unit selects multiple optimum inline QC parameters from the representational inline QC parameters, and calculates weights of each optimum inline QC parameter. The collection unit calculates a predicted yield rate according to the historical yield rate, weights, and a plurality of measurement and target values relating to the wafer products.

BRIEF DESCRIPTION OF THE DRAWINGS

The invention can be more fully understood by reading the subsequent detailed description and examples of embodiments thereof with reference made to the accompanying drawings, wherein.

DETAILED DESCRIPTION

Figure 1:
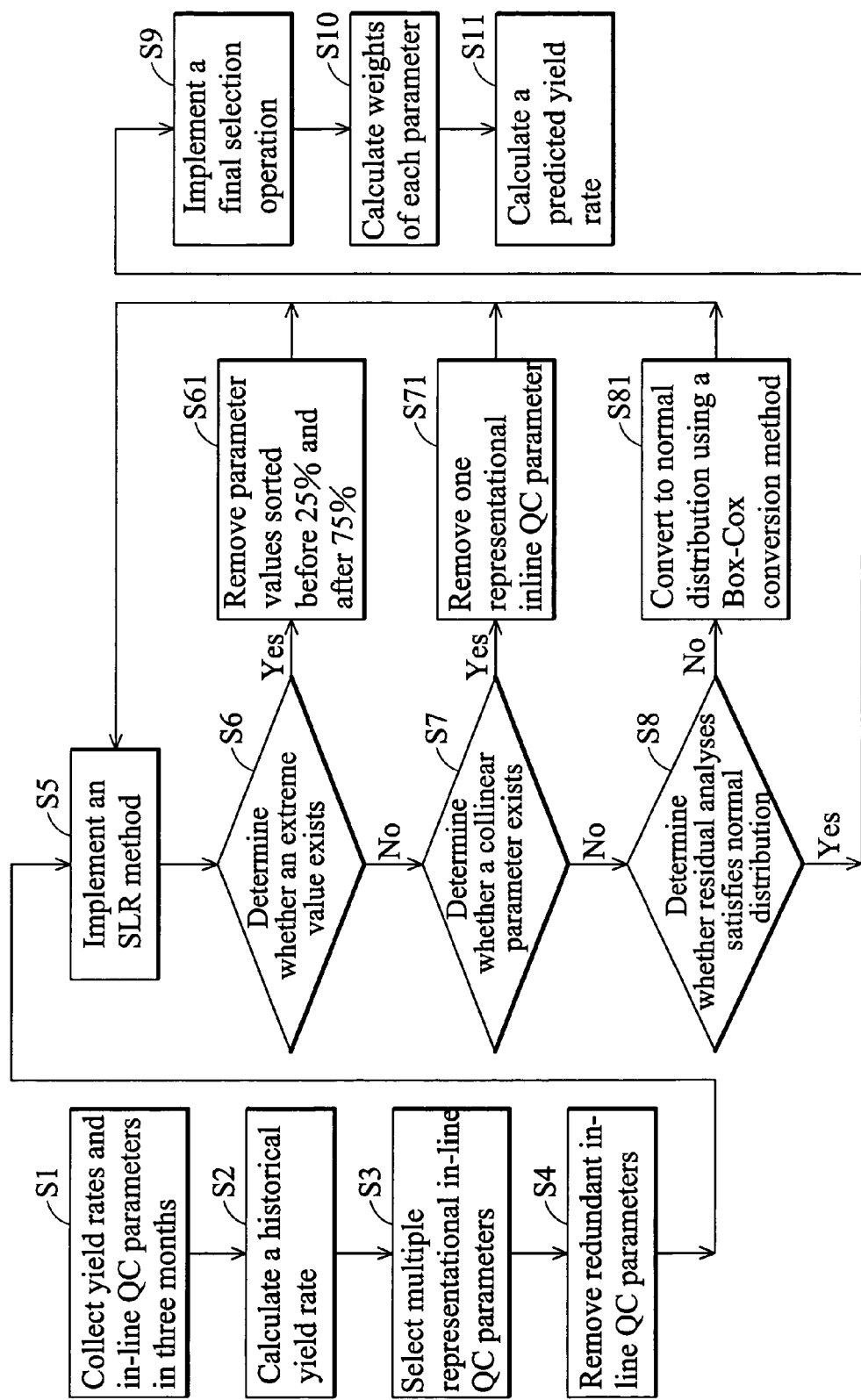
FIG. 1 is a flowchart of an embodiment of a real-time management method for manufacturing management and yield rate analysis integration.

Embodiments of the invention disclose a real-time management system and method for manufacturing management and yield rate analysis integration.

A yield rate analysis method of an embodiment of the invention collects and analyzes parameters and historical yield rate data, and calculates a predicted yield rate for a manufacturing period (every day, for example) according to analysis results and the historical yield rate data.

As wafer lots are processed using defection inspection, WAT tests, and CP tests, related data (parameters as described) of the wafer lots of each process are generated and stored in a database. The data can be used for analysis during a semiconductor manufacturing process and is correlated when yield rate loss occurs. Parameter analysis locates representational yield rate parameters corresponding to wafer lots from the database.

Yield rate parameters for semiconductor manufacturing comprises die size, defect map pattern, defective die (%), WAT, wafer bin map, die yield rate (%), and so forth, each described as follows.

The die size parameter determines defect locations, with larger size resulting in lower yield rates.

Defects on wafers are major causes of yield rate loss and defect patterns comprise systematic defects and random defects. Systematic defect patterns comprise scratched, circular, radial, and centrally clustered patterns and randomly distributed defects formed as random defect patterns. Random defect patterns are generated by particles randomly impacting wafers. Systematic defect patterns are generated by scratches, unaligned masks, chemical damage, etching, and so forth. Additionally, systematic defect patterns are generated when process issues occur, particularly resulting in lower yield rate. Defect pattern inspections is implemented layer-by-layer, thus requiring considerations of pattern types of defects based on yield rate parameters.

A defective die (%) represents a percentage of defect affections of a die when a defect area exceeds a predetermined value. Large defect areas may result in short or broken circuits to cause yield rate loss.

A WAT test is implemented after manufacturing processes are complete, measuring five points to determine whether measured parameters exceed threshold values or abnormal conditions occur.

Wafer bins represent test data of each die based on electrical function processes. The test step is also referred to as a circuit probing (CP) test, implementing a series of pass/fail tests and sorting dies for different functional levels.

Bin values are assigned according to CP test results after the CP test is complete, calculating CP yield rate values.

In addition to the described yield rate parameters, others comprise, but are not limited to, process stages with occurrence of yield rate loss, execution frequency of a process tool, and so forth.

As described, embodiments of the invention analyze collected parameters for yield rate prediction using a statistical formula, represented as:

$$Y_{t_{predict}} = Y_{history} - \sum_{i=1}^{n} (w_i * |q_i - q_{ti}|),$$

where $Y_{t_{predict}}$ represents a predicted yield rate on t-th day, $Y_{history}$ represents an average, yield rate in three months, n represents the number of inline QC parameters (derived using a stepwise linear regression (SLR) model), $w_i$ represents a weight of an inline QC parameter affecting inline QC parameters, $q_i$ represents a measurement value according to an inline QC parameter on t-th day (measured and derived using a manufacturing execution system (MES) on t-th day), and $q_{ti}$ represents a target value according to an inline QC parameter on t-th day (measured and derived using the manufacturing execution system (MES) on t-th day).

Predicted yield rates of each day can be easily obtained based on the statistical formula and implements production management more effectively according for efficiency enhancement and cost reduction.

FIG. 1 is a flowchart of an embodiment of a real-time management method for manufacturing management and yield rate analysis integration.

Yield rates and inline QC parameters relating to wafer products in three months are first collected (step S1) and averaged for a historical yield rate ($Y_{history}$) (step S2). Next, multiple representational inline QC parameters are selected from the inline QC parameters based on manufacturing states using a selection method (step S3). The representational inline QC parameters are inspected to remove redundant inline QC parameters (step S4). A stepwise linear regression (SLR) method is then implemented (step S5).

It is determined whether an extreme value exists in the representational inline QC parameters (step S6), and, if so, the process proceeds to step S61, and, if not, to step S7. If any extreme value exists, parameter values sorted before 25% and after 75% are removed from the representational inline QC parameters (step S61), and the process proceeds to step S5. Extreme values of embodiments of the invention are self-defined and comprise different settings based on different processes. One inline QC parameter, for example, comprising a maximum or minimum value may not appropriately respond to manufacturing states, requiring it to be removed.

If no extreme value exists, it is then determined whether a collinear parameter exists in the representational inline QC parameters (step S7), and, if so, the process proceeds to step S71, and, if not, to step S8. If any collinear parameter exists, representing any two parameters of the same values but different definitions, one representational inline QC parameter is removed from the representational inline QC parameters (step S71), and the process proceeds to step S5.

If no collinear parameter exists, it is determined whether residual analyses relating to the statistical process satisfy normal distribution (step S8), and, if so, the process proceeds to step S81, and, if not, to step S9. If the analysis result satisfies abnormal distribution, it is converted to normal distribution using a Box-Cox conversion method (step S81), and the process proceeds to step S5. If the analysis result satisfies normal distribution, multiple optimum inline QC parameters are selected from the representational inline QC parameters using a final selection method (step S9). First twenty (i.e. n=20) representational parameters are selected in the embodiment of the invention. Next, weights of each parameter are calculated (step S10). A predicted yield rate ($Y_{t_{predict}}$) is calculated according to the historical yield rate ($Y_{history}$), weights ($w_i$) of each parameter, the number (n) of parameters, and measurement and target values ($q_i$ and $q_{ti}$) relating to the wafer products using the statistical formula (step S11).

Figure 2:
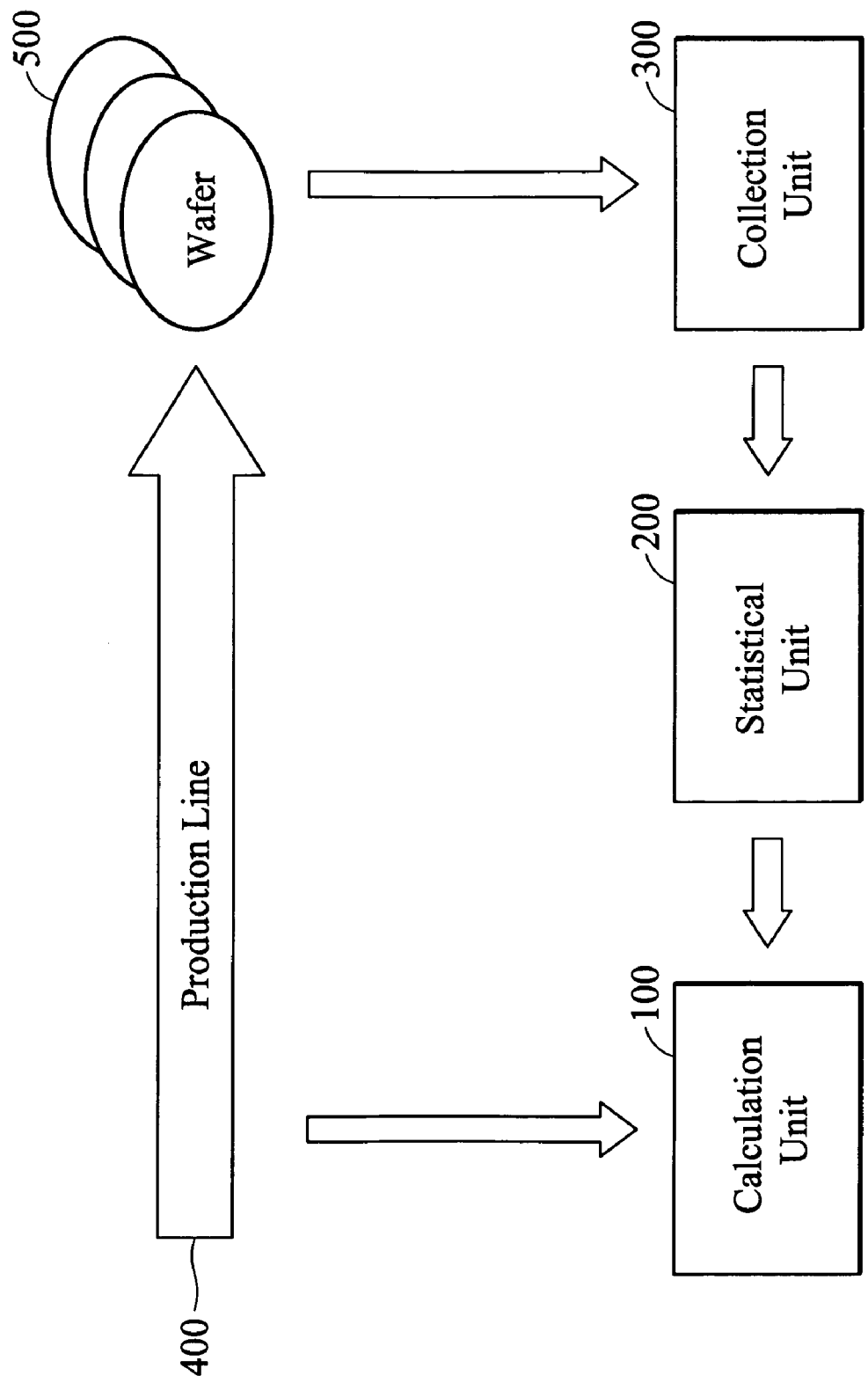
FIG. 2 is a schematic view of an embodiment of a real-time management system for manufacturing management and yield rate analysis integration.

FIG. 2 is a schematic view of an embodiment of a real-time management system for manufacturing management and yield rate analysis integration.

The real-time management system of an embodiment of the invention comprises a calculation unit 100, a statistical unit 200, and a collection unit 300. Wafer lots are manufactured with multiple processes in production lines 400, thereby generating wafers 500.

Collection unit 300 collects yield rates and inline QC parameters relating to wafer products in three months, transferred to statistical unit 200.

Statistical unit 200 averages the yield rate to obtain a historical yield rate ($Y_{history}$), selects multiple representational inline QC parameters from the inline QC parameters based on manufacturing states using a selection method, inspects the representational inline QC parameters to remove redundant inline QC parameters and implements a stepwise linear regression (SLR) method is then. Next, statistical unit 200 determines whether an extreme value exists in the representational inline QC parameters, and, if so, removes parameter values sorted before 25% and after 75% from the representational inline QC parameters, and, if not, determines whether a collinear parameter exists in the representational inline QC parameters, and, if so, removes one representational inline QC parameter from the representational inline QC parameters, and, if not, determines whether residual analyses relating to the statistical process satisfy normal distribution. If not, each is converted to normal distribution using a Box-Cox conversion method. If so, statistical unit 200 selects multiple optimum inline QC parameters from the representational inline QC parameters using a final selection method (selecting first twenty (i.e. n=20) representational parameters) and calculating weights of each parameter. Calculation unit 100 calculates a predicted yield rate ($Y_{t_{predict}}$) according to the historical yield rate ($Y_{history}$), weights ($w_i$) of each parameter, the number (n) of parameters, and measurement and target values ($q_i$ and $q_{ti}$) relating to the wafer products using a statistical formula $$\left( Y_{t_{predict}} = Y_{history} - \sum_{i=1}^{n}(w_i * |q_i - q_{ti}|) \right).$$

Embodiments of real-time management methods of the invention integrate test data of each manufacturing stage and production data of specified wafer lots, performing sorting and management processes based on wafer parameters (such as occurrence causes, departments, and so forth). Additionally, real-time management and yield rate analysis can effectively increase production efficiency and decrease production cost.

Although the present invention has been described in terms of preferred embodiment, it is not intended to limit the invention thereto. Those skilled in the technology can still make various alterations and modifications without departing from the scope and spirit of this invention. Therefore, the scope of the present invention shall be defined and protected by the following claims and their equivalents.

What is claimed is:

1. A real-time management method for manufacturing management and yield rate analysis integration, comprising:
    collecting a plurality of yield rates and inline QC parameters relating to wafer products in a predetermined period;
    summing and averaging the yield rates for a historical yield rate;
    selecting multiple representational inline QC parameters;
    implementing a statistical process, comprising:
        determining whether at least one extreme value exists in the representational inline QC parameters;
        if no extreme value exists, determining whether at least one collinear parameter exists in the representational inline QC parameters; and
        if no collinear parameter exists, determining whether residual analyses relating to the statistical process satisfy normal distribution;
    if the analysis result satisfies normal distribution, selecting multiple optimum inline QC parameters from the representational inline QC parameters;
    calculating weights of each optimum inline QC parameter; and
    calculating a predicted yield rate according to the historical yield rate, weights, and a plurality of measurement and target values relating to the wafer products.

2. The method as claimed in claim 1, wherein if an extreme value exists in the representational inline QC parameters, parameter values sorted before 25% and after 75% are removed therefrom.

3. The method as claimed in claim 1, wherein if a collinear parameter exists in the representational inline QC parameters, one representational inline QC parameter is removed therefrom.

4. The method as claimed in claim 1, wherein if the analysis result satisfies abnormal distribution, it is converted to normal distribution using a Box-Cox conversion method.

5. The method as claimed in claim 1, wherein the determining operations are implemented using a stepwise linear regression (SLR) method.

6. A real-time management system for manufacturing management and yield rate analysis integration, comprising:
    a collection unit, collecting a plurality of yield rates and inline QC parameters relating to wafer products in a predetermined period;
    a statistical unit, summing and averaging the yield rates for a historical yield rate, selecting multiple representational inline QC parameters, implementing a statistical process, comprising determining whether at least one extreme value exists in the representational inline QC parameters, if no extreme value exists, determining whether at least one collinear parameter exists in the representational inline QC parameters, if no collinear parameter exists, determining whether residual analyses relating to the statistical process satisfy normal distribution, if the analysis result satisfies normal distribution, selecting multiple optimum inline QC parameters from the representational inline QC parameters, and calculating weights of each optimum inline QC parameter; and
    a collection unit, calculating a predicted yield rate according to the historical yield rate, weights, and a plurality of measurement and target values relating to the wafer products.

7. The system as claimed in claim 6, wherein if an extreme value exists in the representational inline QC parameters, the statistical unit removes parameter values sorted before 25% and after 75% therefrom.

8. The system as claimed in claim 6, wherein if a collinear parameter exists in the representational inline QC parameters, the statistical unit removes one representational inline QC parameter therefrom.

9. The system as claimed in claim 6, wherein if the analysis result satisfies abnormal distribution, it is converted to normal distribution using a Box-Cox conversion method.

10. The system as claimed in claim 6, wherein the statistical unit implements the determining operations using a stepwise linear regression (SLR) method.

* * * * *